(12) United States Patent
Chen et al.

(10) Patent No.: US 12,386,529 B2
(45) Date of Patent: Aug. 12, 2025

(54) READ VOLTAGE CALIBRATION METHOD, MEMORY STORAGE DEVICE AND MEMORY CONTROL CIRCUIT UNIT

(71) Applicant: PHISON ELECTRONICS CORP., Miaoli (TW)

(72) Inventors: Szu-Wei Chen, New Taipei (TW); Yu-Hung Lin, Miaoli County (TW); I-Sung Huang, Miaoli County (TW); Po-Cheng Su, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 188 days.

(21) Appl. No.: 18/336,911

(22) Filed: Jun. 16, 2023

(65) Prior Publication Data

US 2024/0377972 A1 Nov. 14, 2024

(30) Foreign Application Priority Data

May 11, 2023 (TW) .................................. 112117594

(51) Int. Cl.
*G06F 3/06* (2006.01)
*G06F 12/1009* (2016.01)
(Continued)

(52) U.S. Cl.
CPC .......... *G06F 3/0625* (2013.01); *G06F 3/0659* (2013.01); *G06F 3/0679* (2013.01);
(Continued)

(58) Field of Classification Search
CPC .... G06F 3/0625; G06F 3/0659; G06F 3/0679; G06F 12/1009; G06F 12/0246;
(Continued)

(56) References Cited

U.S. PATENT DOCUMENTS

| 2012/0254699 | A1* | 10/2012 | Ruby | ................... G11C 29/028 |
| | | | | 714/E11.034 |
| 2019/0354313 | A1* | 11/2019 | Sheperek | ............. G11C 29/028 |

(Continued)

OTHER PUBLICATIONS

"Office Action of Taiwan Counterpart Application", issued on Jun. 28, 2024, p. 1-p. 16.

*Primary Examiner* — Michael Krofcheck
(74) *Attorney, Agent, or Firm* — JCIPRNET

(57) ABSTRACT

A read voltage calibration method, a memory storage device, a memory control circuit unit are provided, including: reading, according to a first read command, a first physical unit based on a first read voltage level to obtain first data, and the first read voltage level is a default read voltage level corresponding to the first physical unit or a first voltage difference exists between the first read voltage level and the default read voltage level; decoding the first data to obtain first error bit information; reading, according to a second read command, the first physical unit based on a second read voltage level to obtain second data, and a second voltage difference exists between the second read voltage level and the default read voltage level; decoding the second data to obtain second error bit information; calibrating the default read voltage level according to the first and second error bit information.

24 Claims, 6 Drawing Sheets

(51) Int. Cl.
    *G11C 16/26*    (2006.01)
    *G11C 29/50*    (2006.01)
    *G11C 16/04*    (2006.01)
(52) U.S. Cl.
    CPC .......... *G06F 12/1009* (2013.01); *G11C 16/26* (2013.01); *G11C 29/50004* (2013.01); *G11C 16/0483* (2013.01); *G11C 2029/5004* (2013.01)
(58) Field of Classification Search
    CPC ..... G06F 2212/1028; G06F 2212/7204; G06F 2212/7206; G11C 16/26; G11C 29/50004; G11C 16/0483; G11C 2029/5004; G11C 11/5642; G11C 29/021; G11C 29/028
    See application file for complete search history.

(56) References Cited

U.S. PATENT DOCUMENTS

| | | | |
|---|---|---|---|
| 2020/0105353 A1 | 4/2020 | Sharon et al. | |
| 2021/0200613 A1* | 7/2021 | Cadloni | ............. G11C 11/5642 |
| 2023/0134545 A1* | 5/2023 | Eliash | ................. G06F 3/0679 |
| | | | 711/154 |

* cited by examiner

READ VOLTAGE CALIBRATION METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 112117594, filed on May 11, 2023. The entirety of the above-mentioned patent application is hereby incorporated by reference herein and made a part of this specification.

BACKGROUND OF THE INVENTION

Field of the Invention

The invention relates to a memory management technique, and more particularly, to a read voltage calibration method, a memory storage device, and a memory control circuit unit.

Description of Related Art

Portable electronic devices such as mobile phones and notebook computers have grown rapidly in the past few years, which has led to a rapid increase in consumer demand for storage media. Since a rewritable non-volatile memory module (such as a flash memory) has characteristics such as data non-volatility, power-saving, small size, and lack of mechanical structures, the rewritable non-volatile memory module is very suitable to be built into the various portable electronic devices provided above.

When the memory storage device leaves the factory, the read voltage level for reading data from the rewritable non-volatile memory module is at a default voltage position. As the usage time of the rewritable non-volatile memory module is increased, the threshold voltage distribution of memory cells in the rewritable non-volatile memory module is offset. At this time, reading data from the rewritable non-volatile memory module using the factory-set read voltage level has a very high probability of reading a large number of error bits. If the read data contains too many error bits, these error bits may not be completely corrected, resulting in read error.

In general, when the voltage position of the read voltage level is offset significantly compared with the threshold voltage distribution of the memory cells, the optimal voltage position of the current read voltage level may be found using an optimal read level search operation. However, during the optimal read level search operation, a specific physical page or physical block in the rewritable non-volatile memory module is repeatedly read many times, resulting in extra energy consumption of the memory storage device. Moreover, if the optimal read level search operation occurs in a general read program (for example, performed after a plurality of hard decode failures), the optimal read level search operation causes the data read performance of the memory storage device to drop significantly.

SUMMARY OF THE INVENTION

The invention provides a read voltage calibration method, a memory storage device, and a memory control circuit unit that may calibrate a read voltage with minimal influence to the data reading performance of the memory storage device.

An exemplary embodiment of the invention provides a read voltage calibration method configured for a rewritable non-volatile memory module, wherein the rewritable non-volatile memory module includes a plurality of physical units, and the read voltage calibration method includes: receiving a first read command from a host system, wherein the first read command instructs to read data belonging to a first logical unit, and the first logical unit is mapped to a first physical unit in the plurality of physical units; reading, according to the first read command, the first physical unit based on a first read voltage level to obtain first data, and the first read voltage level is a default read voltage level corresponding to the first physical unit or a first voltage difference exists between the first read voltage level and the default read voltage level; decoding the first data to obtain first error bit information corresponding to the first data; receiving a second read command from the host system, wherein the second read command instructs to read the data belonging to the first logical unit; reading, according to the second read command, the first physical unit based on a second read voltage level to obtain second data, and a second voltage difference exists between the second read voltage level and the default read voltage level; decoding the second data to obtain second error bit information corresponding to the second data; and calibrating the default read voltage level according to the first error bit information and the second error bit information.

An exemplary embodiment of the invention provides a memory storage device including a connection interface unit, a rewritable non-volatile memory module, and a memory control circuit unit. The connection interface unit is configured to be coupled to a host system. The rewritable non-volatile memory module includes a plurality of physical units. The memory control circuit unit is coupled to the connection interface unit and the rewritable non-volatile memory module. The memory control circuit unit is configured to: receive a first read command from the host system, wherein the first read command instructs to read data belonging to a first logical unit, and the first logical unit is mapped to a first physical unit in the plurality of physical units; send, according to the first read command, a first read command sequence instructing to read the first physical unit based on a first read voltage level to obtain first data, and the first read voltage level is a default read voltage level corresponding to the first physical unit or a first voltage difference exists between the first read voltage level and the default read voltage level; decode the first data to obtain first error bit information corresponding to the first data; receive a second read command from the host system, wherein the second read command instructs to read the data belonging to the first logical unit; send, according to the second read command, a second read command sequence instructing to read the first physical unit based on a second read voltage level to obtain second data, and a second voltage difference exists between the second read voltage level and the default read voltage level; decode the second data to obtain second error bit information corresponding to the second data; and calibrate the default read voltage level according to the first error bit information and the second error bit information.

An exemplary embodiment of the invention provides a memory control circuit unit configured to control a rewritable non-volatile memory module, wherein the rewritable non-volatile memory module includes a plurality of physical units. The memory control circuit unit includes a host interface, a memory interface, an error detection and correction circuit, and a memory management circuit. The host interface is configured to be coupled to a host system. The memory interface is configured to be coupled to the rewritable non-volatile memory module. The memory management circuit is coupled to the host interface, the memory interface, and the error detection and correction circuit. The memory management circuit is configured to: receive a first read command from the host system, wherein the first read command instructs to read data belonging to a first logical unit, and the first logical unit is mapped to a first physical unit in the plurality of physical units; send, according to the first read command, a first read command sequence instructing to read the first physical unit based on a first read voltage level to obtain first data, and the first read voltage level is a default read voltage level corresponding to the first physical unit or a first voltage difference exists between the first read voltage level and the default read voltage level; decode the first data via the error detection and correction circuit to obtain first error bit information corresponding to the first data; receive a second read command from the host system, wherein the second read command instructs to read the data belonging to the first logical unit; send, according to the second read command, a second read command sequence instructing to read the first physical unit based on a second read voltage level to obtain second data, and a second voltage difference exists between the second read voltage level and the default read voltage level; decode the second data via the error detection and correction circuit to obtain second error bit information corresponding to the second data; and calibrate the default read voltage level according to the first error bit information and the second error bit information.

Based on the above, according to the plurality of read commands directed at the same physical unit (i.e., the first physical unit) from the host system, different read voltage levels may be used to read the first physical unit, and the default read voltage level corresponding to the first physical unit may be calibrated according to the read results and/or decode results of these read commands. In this way, the default read voltage level of the physical units may be effectively calibrated with minimal influence to the data reading performance of the memory storage device.

DESCRIPTION OF THE EMBODIMENTS

In general, a memory storage device (also referred to as a memory storage system) includes a rewritable non-volatile memory module and a controller (also referred to as a control circuit). The memory storage device may be used with a host system, such that the host system may write data into the memory storage device or read data from the memory storage device.

Figure 1:
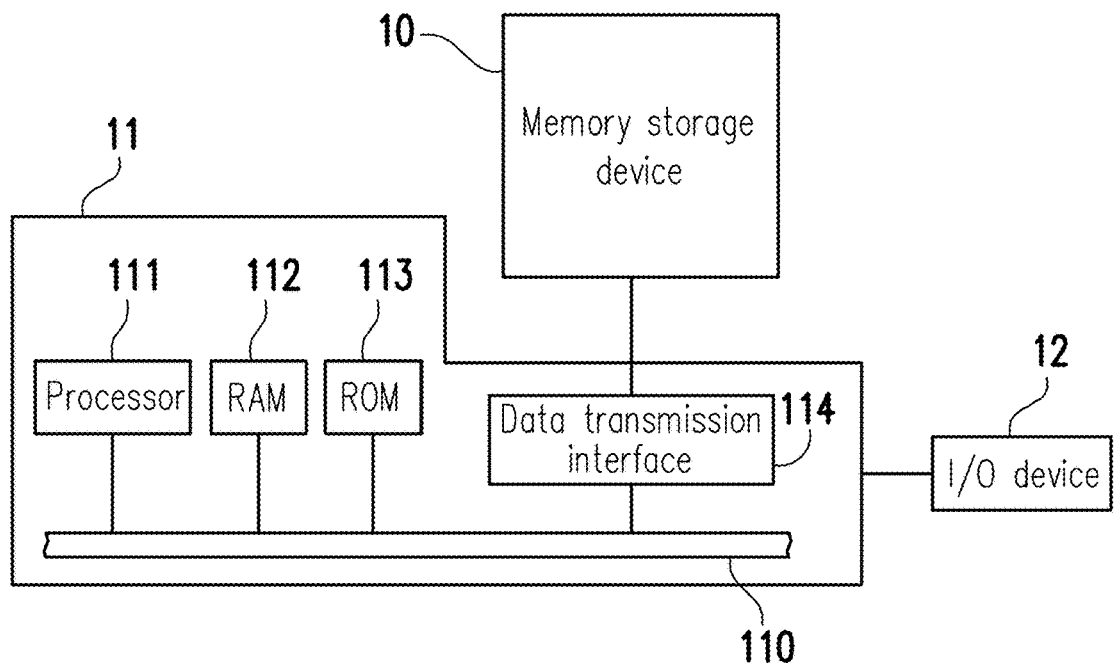
FIG. 1 is a schematic diagram of a host system, a memory storage device, and an input/output (I/O) device shown according to an exemplary embodiment of the invention.
Figure 2:
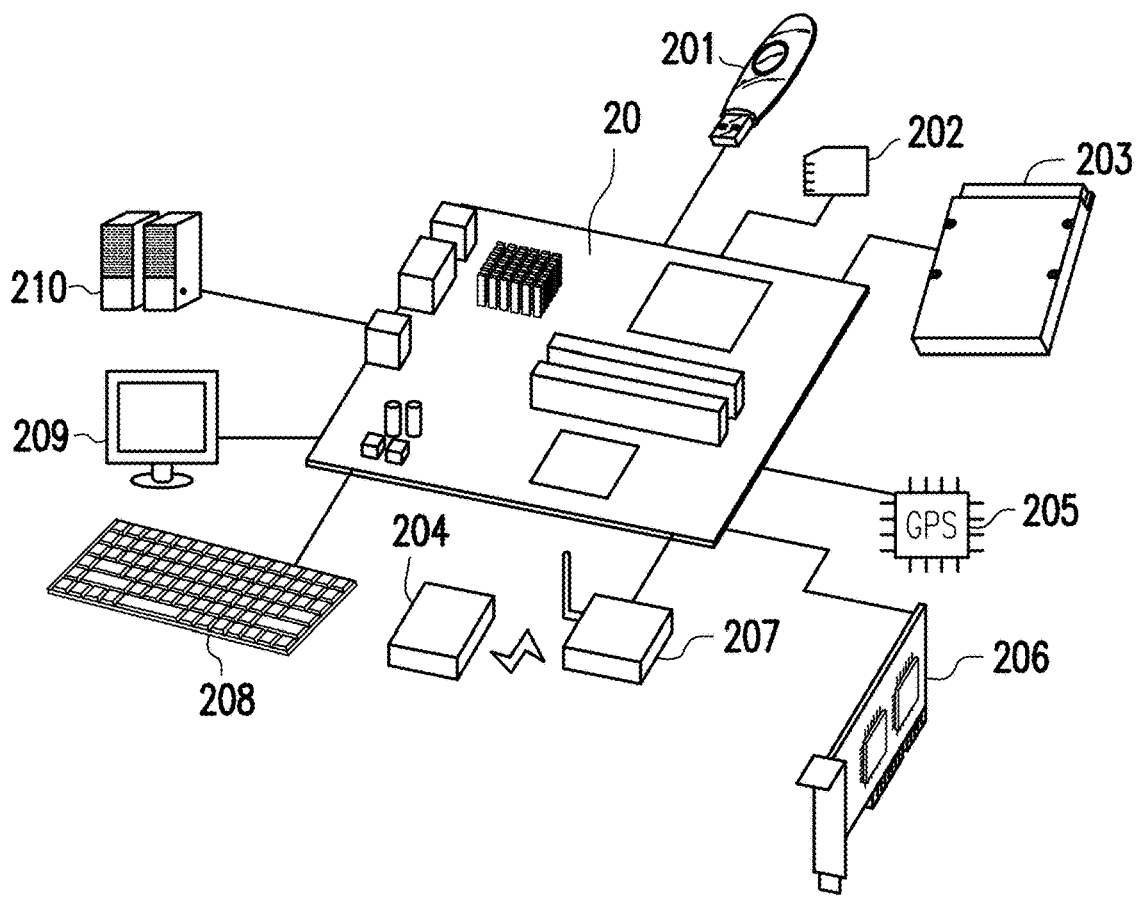
FIG. 2 is a schematic diagram of a host system, a memory storage device, and an I/O device shown according to an exemplary embodiment of the invention.

FIG. 1 is a schematic diagram of a host system, a memory storage device, and an input/output (I/O) device shown according to an exemplary embodiment of the invention. FIG. 2 is a schematic diagram of a host system, a memory storage device, and an I/O device shown according to an exemplary embodiment of the invention.

Referring to FIG. 1 and FIG. 2, a host system 11 may include a processor 111, a random-access memory (RAM) 112, a read-only memory (ROM) 113, and a data transmission interface 114. The processor 111, the RAM 112, the ROM 113, and the data transmission interface 114 may be coupled to a system bus 110.

In an exemplary embodiment, the host system 11 may be coupled to the memory storage device 10 via the data transmission interface 114. For example, the host system 11 may store data into the memory storage device 10 or read data from the memory storage device 10 via the data transmission interface 114. Moreover, the host system 11 may be coupled to the I/O device 12 via the system bus 110. For example, the host system 11 may send an output signal to the I/O device 12 or receive an input signal from the I/O device 12 via the system bus 110.

In an exemplary embodiment, the processor 111, the RAM 112, the ROM 113, and the data transmission interface 114 may be disposed on a motherboard 20 of the host system 11. The quantity of the data transmission interface 114 may be one or a plurality. The motherboard 20 may be coupled to the memory storage device 10 in a wired or wireless method via the data transmission interface 114.

In an exemplary embodiment, the memory storage device 10 may be, for example, a flash drive 201, a memory card 202, a solid-state drive (SSD) 203, or a wireless memory storage device 204. The wireless memory storage device 204 may be, for example, a memory storage device based on various wireless communication techniques such as a near-field communication (NFC) memory storage device, a wireless fax (WiFi) memory storage device, a Bluetooth memory storage device, or a low-power Bluetooth memory storage device (such as iBeacon). Moreover, the motherboard 20 may also be coupled to various I/O devices such as a global positioning system (GPS) module 205, a network interface card 206, a wireless transmission device 207, a keyboard 208, a screen 209, or a speaker 210 via the system bus 110. For example, in an exemplary embodiment, the motherboard 20 may access the wireless memory storage device 204 via the wireless transmission device 207.

In an exemplary embodiment, the host system 11 is a computer system. In an exemplary embodiment, the host system 11 may be any system that may substantially store data with the memory storage device. In an exemplary embodiment, the memory storage device 10 and the host system 11 may respectively include a memory storage device 30 and a host system 31 of FIG. 3.

Figure 3:
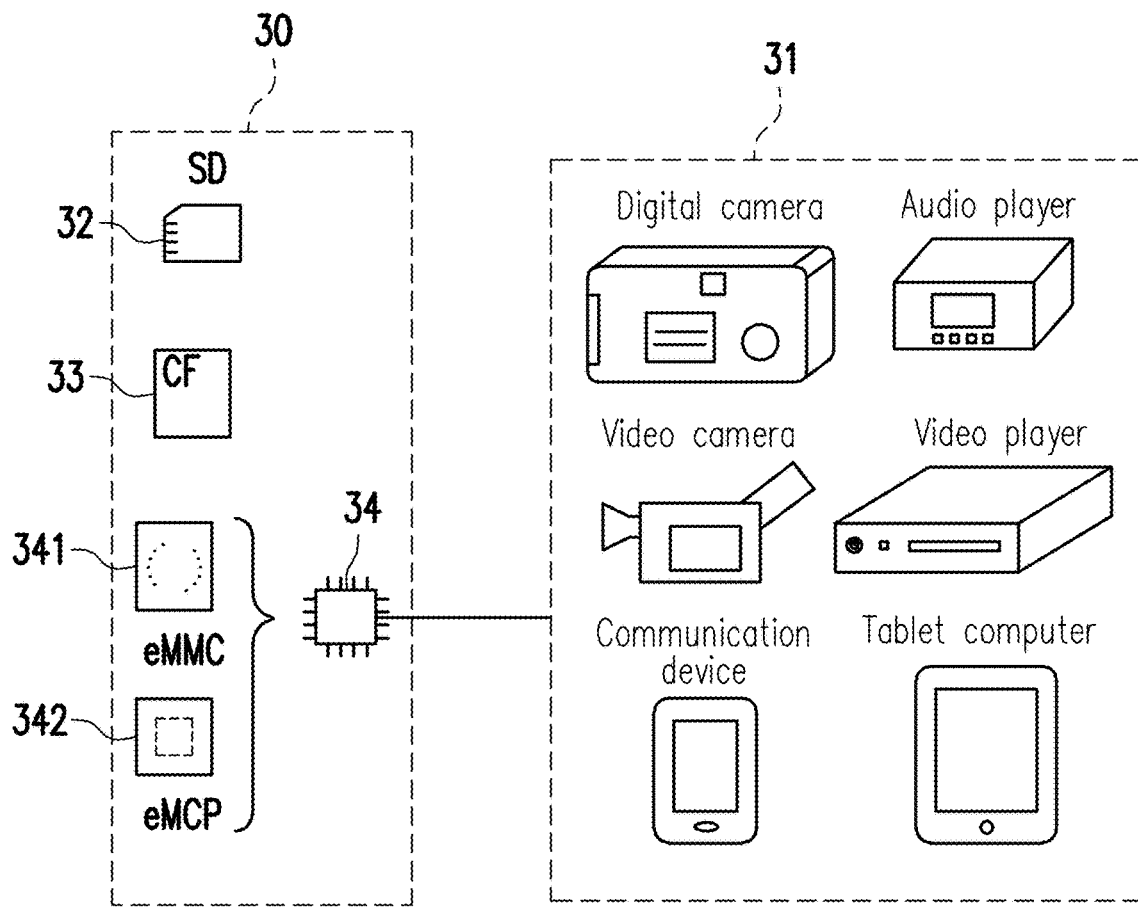
FIG. 3 is a schematic of a host system and a memory storage device shown according to an exemplary embodiment of the invention.

FIG. 3 is a schematic of a host system and a memory storage device shown according to an exemplary embodiment of the invention. Referring to FIG. 3, the memory storage device 30 may be used in conjunction with the host system 31 to store data. For example, the host system 31 may be a system such as a digital camera, a video camera, a communication device, an audio player, a video player, or a tablet computer. For example, the memory storage device 30 may be various non-volatile memory storage devices such as a Secure Digital (SD) card 32, a Compact Flash (CF) card 33, or an embedded storage device 34 used by the host system 31. The embedded storage device 34 includes various types of embedded storage devices for which a memory module is directly coupled on the substrate of the host system, such as an embedded multimedia card (eMMC) 341 and/or an embedded multi-chip package (eMCP) storage device 342.

Figure 4:
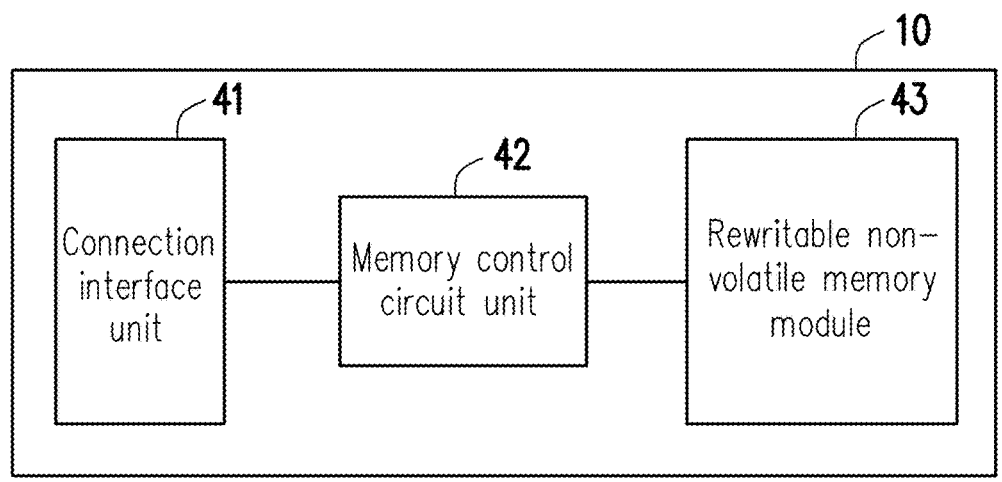
FIG. 4 is a schematic block diagram of a memory storage device shown according to an exemplary embodiment of the invention.

FIG. 4 is a schematic block diagram of a memory storage device shown according to an exemplary embodiment of the invention. Referring to FIG. 4, the memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may communicate with the host system 11 via the connection interface unit 41. In an exemplary embodiment, the connection interface unit 41 is compatible with the Peripheral Component Interconnect Express (PCI Express) standard. In an exemplary embodiment, the connection interface unit 41 may also conform to the Serial Advanced Technology Attachment (SATA) standard, Parallel Advanced Technology Attachment (PATA) standard, Institute of Electrical and Electronic Engineers (IEEE) 1394 standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 41 may be sealed in a chip with the memory control circuit unit 42. Alternatively, the connection interface unit 41 is disposed outside of a chip containing the memory control circuit unit 42.

The memory control circuit unit 42 is coupled to the connection interface unit 41 and the rewritable non-volatile memory module 43. The memory control circuit unit 42 is configured to perform a plurality of logic gates or control commands implemented in a hardware form or in a firmware form. The memory control circuit unit 404 also performs operations such as writing, reading, and erasing data in the rewritable non-volatile memory storage module 43 according to the commands of the host system 11.

The rewritable non-volatile memory module 43 is configured to store the data written by the host system 11. The rewritable non-volatile memory module 43 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 43 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 43 has a plurality of storage statuses. Which storage status one memory cell belongs to may be determined via the application of a read voltage, so as to obtain one or a plurality of bits stored by the memory cell.

In an exemplary embodiment, the memory cells of the rewritable non-volatile memory module 43 may form a plurality of physical programming units, and these physical programming units may form a plurality of physical erasing units. Specifically, the memory cells on the same word line may form one or a plurality of physical programming units. If each of the memory cells may store 2 or more bits, the physical programming units on the same word line may be at least classified into lower physical programming units and upper physical programming units. For example, the least significant bit (LSB) of a memory cell belongs to the lower physical programming units, and the most significant bit (MSB) of a memory cell belongs to the upper physical programming units. Generally, in an MLC NAND-type flash memory, the write speed of the lower physical programming units is greater than the write speed of the upper physical programming units, and/or the reliability of the lower physical programming units is greater than the reliability of the upper physical programming units.

In an exemplary embodiment, the physical programming unit is the smallest unit of programming. That is, the physical programming unit is the smallest unit of data writing. For example, the physical programming unit may be a physical page or a physical sector. If the physical programming unit is a physical page, then the physical programming units may include a data bit area and a redundancy bit area. The data bit area contains a plurality of physical sectors configured to store user data, and the redundancy bit area is configured to store system data (for example, management data such as an error correcting code (ECC)). In an exemplary embodiment, the data bit area includes 32 physical sectors, and the size of one physical sector is 512 bytes (B). However, in other exemplary embodiments, the data bit area may also contain 8, 16, or a greater or lesser number of physical sectors, and the size of each of the physical sectors may also be greater or smaller. Moreover, the physical erasing unit is the smallest unit of erasing. That is, each of the physical erasing units contains the smallest number of memory cells erased together. For example, the physical erasing unit is a physical block.

Figure 5:
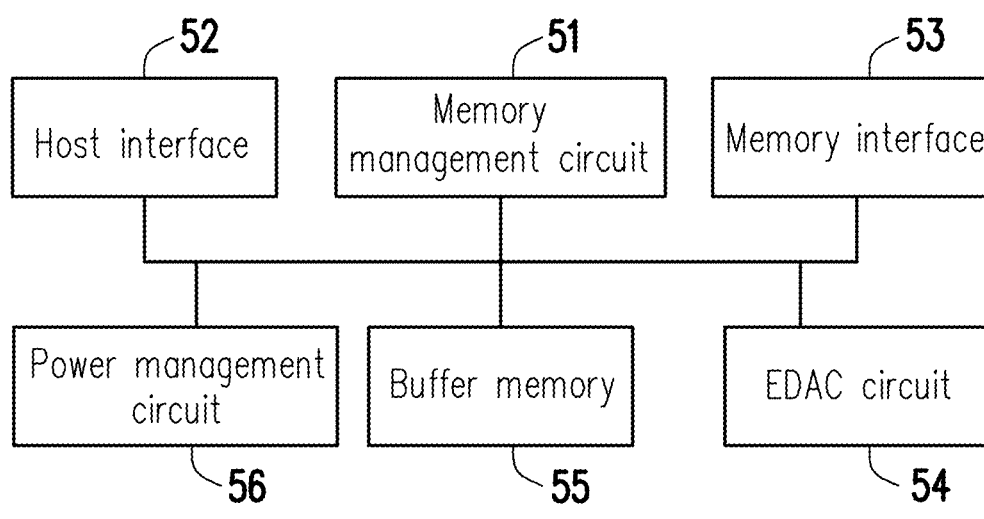
FIG. 5 is a schematic block diagram of a memory control circuit unit shown according to an exemplary embodiment of the disclosure.

FIG. 5 is a schematic block diagram of a memory control circuit unit shown according to an exemplary embodiment of the invention. Referring to FIG. 5, the memory control circuit unit 42 includes a memory management circuit 51, a host interface 52, a memory interface 53, and an error detection and correction (EDAC) circuit 54.

The memory management circuit 51 is configured to control the overall operation of the memory control circuit unit 42. Specifically, the memory management circuit 51 has a plurality of control commands. During the operation of the memory storage device 10, the control commands are executed to perform operations such as writing, reading, and erasing data. In the following, descriptions relating to the operation of the memory management circuit 51 are equivalent to the descriptions of the operation of the memory control circuit unit 42.

In an exemplary embodiment, the control commands of the memory management circuit 51 are implemented in a firmware form. For example, the memory management circuit 51 has a microprocessor unit (not shown) and a read-only memory (not shown), and the control commands are burned into the ROM. During the operation of the memory storage device 10, the control commands are executed by the microprocessor unit to perform operations such as writing, reading, and erasing data.

In an exemplary embodiment, the control commands of the memory management circuit 51 may also be stored in the form of program codes in a specific area (for example, the system area in a memory module exclusively configured to store system data) of the rewritable non-volatile memory module 43. Moreover, the memory management circuit 51 has a microprocessor unit (not shown), a ROM (not shown), and a RAM (not shown). In particular, the ROM has a boot code, and when the memory control circuit unit 42 is enabled, the microprocessor unit first executes the boot code to load the control commands stored in the rewritable non-volatile memory module 43 into the RAM of the memory management circuit 51. Next, the microprocessor unit runs the control commands to perform operations such as writing, reading, and erasing data.

In an exemplary embodiment, the control commands of the memory management circuit 51 may also be implemented in a hardware form. For example, the memory management circuit 51 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage memory cells or memory cell groups of the rewritable non-volatile memory module 43. The memory write circuit is configured to issue a write command sequence to the rewritable non-volatile memory module 43 to write data into the rewritable non-volatile memory module 43. The memory read circuit is configured to issue a read command sequence to the rewritable non-volatile memory module 43 to read data from the rewritable non-volatile memory module 43. The memory erase circuit is configured to issue an erase command sequence to the rewritable non-volatile memory module 43 to erase data from the rewritable non-volatile memory module 43. The data processing circuit is configured to process the data to be written into the rewritable non-volatile memory module 43 and the data read from the rewritable non-volatile memory module 43. The write command sequence, the read command sequence, and the erase command sequence may independently include one or a plurality of program codes or command codes and be configured to instruct the rewritable non-volatile memory module 43 to perform corresponding operations such as writing, reading, and erasing. In an exemplary embodiment, the memory management circuit 51 may also issue other types of command sequences to the rewritable non-volatile memory module 43 to instruct the performance of corresponding operations.

The host interface 52 is coupled to the memory management circuit 51. The memory management circuit 51 may be communicated with the host system 11 via the host interface 52. The host interface 52 may be configured to receive and identify commands and data sent by the host system 11. For example, the commands and data sent by the host system 11 may be sent to the memory management circuit 51 via the host interface 52. In addition, the memory management circuit 51 may send data to the host system 11 via the host interface 52. In the present exemplary embodiment, the host interface 52 is compatible with the PCI Express standard. However, it should be understood that the invention is not limited thereto, and the host interface 52 may also be compatible with the SATA standard, PATA standard, IEEE 1394 standard, USB standard, SD standard, UHS-I standard, UHS-II standard, MS standard, MMC standard, eMMC standard, UFS standard, CF standard, IDE standard, or other suitable standards for data transmission.

The memory interface 53 is coupled to the memory management circuit 51 and configured to access the rewritable non-volatile memory module 43. For example, the memory management circuit 51 may access the rewritable non-volatile memory module 43 via the memory interface 53. That is, the data to be written into the rewritable non-volatile memory module 43 is converted into a format acceptable to the rewritable non-volatile memory module 43 via the memory interface 53. Specifically, if the memory management circuit 51 is to access the rewritable non-volatile memory module 43, the memory interface 53 transmits the corresponding command sequence. For example, the command sequence may include a write command sequence instructing data writing, a read command sequence instructing data reading, an erase command sequence instructing data erasing, and corresponding command sequences configured to instruct various memory operations (such as changing read voltage level or performing a garbage collection operation). The command sequences are generated by, for example, the memory management circuit 51 and sent to the rewritable non-volatile memory module 43 via the memory interface 53. The command sequences may include one or a plurality of signals or data on a bus. These signals or data may include command codes or program codes. For example, when reading a command sequence, information such as read identification code or memory address is included.

The EDAC circuit 54 is coupled to the memory management circuit 51 and configured to perform an EDAC operation to ensure the correctness of data. Specifically, when the memory management circuit 51 receives a write command from the host system 11, the EDAC circuit 54 generates a corresponding error correcting code (ECC) and/or error detecting code (EDC) for the data corresponding to the write command, and the memory management circuit 51 writes the data corresponding to the write command and the corresponding ECC and/or EDC into the rewritable non-volatile memory module 43. Next, when data is read from the rewritable non-volatile memory module 43, the memory management circuit 51 reads the ECC and/or the EDC corresponding to the data at the same time, and the EDAC circuit 54 performs an EDAC operation on the read data based on the ECC and/or the EDC. For example, the EDAC circuit 54 may support various encoding/decoding algorithms such as Low-Density Parity Check (LDPC) code or BCH.

In an exemplary embodiment, the memory control circuit unit 42 further includes a buffer memory 55 and a power management circuit 56. The buffer memory 55 is coupled to the memory management circuit 51 and configured to temporarily store data. The power management circuit 56 is coupled to the memory management circuit 51 and configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
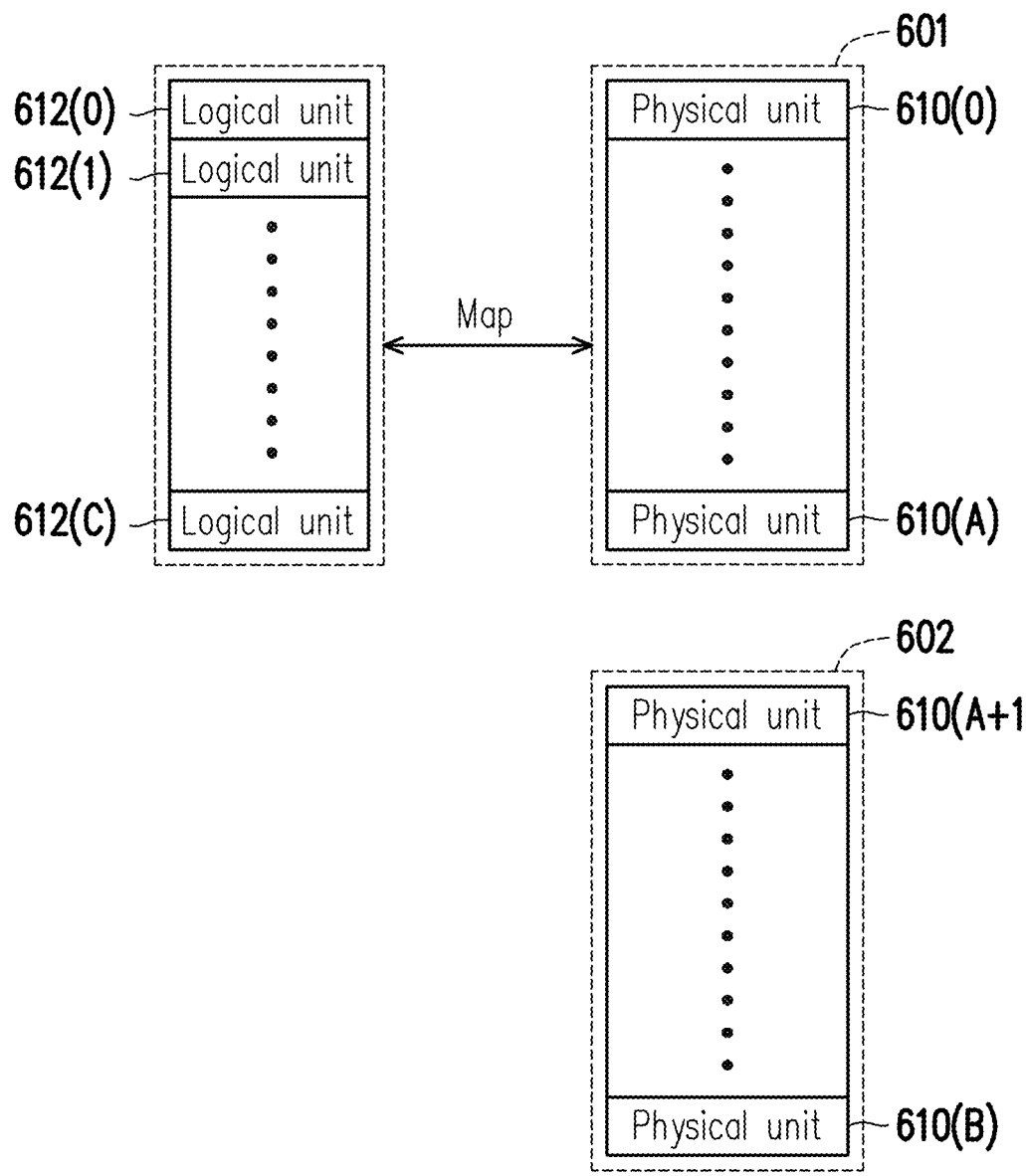
FIG. 6 is a schematic diagram of the management of a rewritable non-volatile memory module shown according to an exemplary embodiment of the invention.

FIG. 6 is a schematic diagram of the management of a rewritable non-volatile memory module shown according to an exemplary embodiment of the invention. Referring to FIG. 6, the memory management circuit 51 may logically group physical units 610(0) to 610(B) in the rewritable non-volatile memory module 43 into a storage area 601 and a spare area 602.

In an exemplary embodiment, one physical unit refers to one physical address or one physical programming unit. In an exemplary embodiment, one physical unit may also be formed by a plurality of continuous or discontinuous physical addresses. In an exemplary embodiment, one physical unit may also refer to one virtual block (VB). One virtual block may include a plurality of physical addresses or a plurality of physical programming units.

Physical units 610(0) to 610(A) in the storage area 601 are configured to store user data (for example, user data from the host system 11 in FIG. 1). For example, the physical units 610(0) to 610(A) in the storage area 601 may store valid data and invalid data. Physical units 610(A+1) to 610(B) in the spare area 602 do not store data (for example, valid data). For example, if a certain physical unit does not store valid data, this physical unit may be associated (or added) to the spare area 602. In addition, the physical units (or physical units that do not store valid data) in the spare area 602 may be erased. When writing new data, one or a plurality of physical units may be extracted from the spare area 602 to store the new data. In an exemplary embodiment, the spare area 602 is also referred to as a free pool.

The memory management circuit 51 may configure logical units 612(0) to 612(C) to map the physical units 610(0) to 610(A) in the storage area 601. In an exemplary embodiment, each of the logic units corresponds to one logical address. For example, one logical address may include one or a plurality of logical block addresses (LBAs) or other logical management units. In an exemplary embodiment, one logical unit may also correspond to one logic programming unit or be formed by a plurality of continuous or discontinuous logical addresses.

It should be noted that one logical unit may be mapped to one or a plurality of physical units. If a certain physical unit is currently mapped by a certain logical unit, the data currently stored in the physical unit is valid data. On the other hand, if a certain physical unit is currently not mapped by any logical unit, the data currently stored in the physical unit is valid data.

The memory management circuit 51 may record management data describing the mapping relationship between logical units and physical units (also referred to as logical-to-physical mapping information) in at least one logical-to-physical mapping table. When the host system 11 is to read data from the memory storage device 10 or write data to the memory storage device 10, the memory management circuit 51 may access the rewritable non-volatile memory module 43 according to the information in the logical-to-physical mapping table.

In an exemplary embodiment, after the rewritable non-volatile memory module 43 is used for a period of time and/or when the ambient temperature is changed more significantly, the memory cells in the rewritable non-volatile memory module 43 may age and/or wear out. In response to aging and/or wear of the memory cells, the threshold voltage of the memory cells may be offset. The offset of the threshold voltage of the memory cells refers to the change of the threshold voltage of the memory cells, for example, offset from a certain voltage position to another voltage position. The offset of the threshold voltage of the memory cells may affect the accuracy of the data read from the memory cells. For example, it is assumed that the threshold voltage of a certain memory cell previously programmed is greater than one default read voltage level. However, due to aging and/or wear, the threshold voltage of the memory cell may be offset to be lower than the default read voltage level. Therefore, if the memory cell is read using the default read voltage level, an error bit may be read from the memory cell. Or, it is assumed that the threshold voltage of a certain memory cell previously programmed is less than one default read voltage level. However, due to aging and/or wear, the threshold voltage of the memory cell may be offset to be greater than the default read voltage level. Therefore, if the memory cell is read using the default read voltage level, an error bit may similarly be read from the memory cell.

In an example embodiment, the EDAC circuit 54 may contain one or a plurality of decoding circuits. The decoding circuit may be used to decode data read from the rewritable non-volatile memory module 43. For example, the decoding circuit may attempt to correct some or all error bits in the read data. For example, in an exemplary embodiment, the EDAC circuit 54 may encode and decode data using an LDPC code. However, in another exemplary embodiment, the EDAC circuit 54 may also support BCH codes, convolutional codes, turbo codes, etc., and the invention is not limited thereto. It should be noted that in certain cases, if the offset of the threshold voltage of the memory cell is too large, the decoding capability (such as decoding success rate) and/or the decoding speed of the decoding circuit may be reduced.

Figure 7:
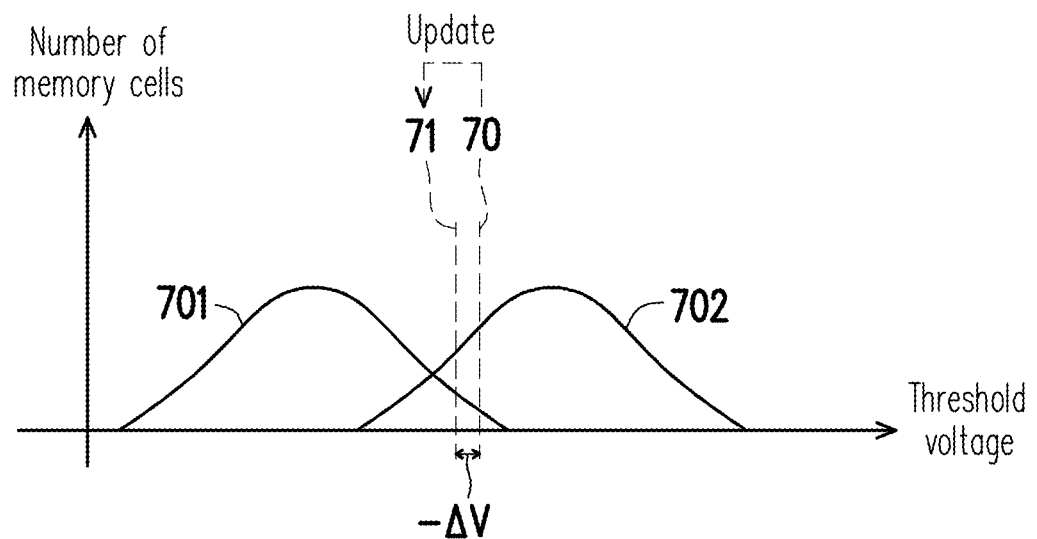
FIG. 7 is a schematic diagram of threshold voltage distribution of memory cells and calibrated default read voltage level shown according to an exemplary embodiment of the invention.

FIG. 7 is a schematic diagram of threshold voltage distribution of memory cells and calibrated default read voltage level shown according to an exemplary embodiment of the invention. Please refer to FIG. 7, taking a certain physical unit (also referred to as a first physical unit) in the rewritable non-volatile memory module 43 as an example, the threshold voltage distribution of the memory cells in the first physical unit includes states 701 and 702. For example, the first physical unit may be one of the physical units 610(0) to 610(A) of FIG. 6. In addition, it is assumed that a read voltage level 70 is one default read voltage level corresponding to the first physical unit.

Ideally, the read voltage level 70 should be located at the junction between the states 701 and 702 to correctly distinguish the memory cells belonging to the states 701 and 702 in the first physical unit. However, as the usage time and/or wear degree of the rewritable non-volatile memory module 43 are/is increased, the threshold voltage distribution of the memory cells in the first physical unit is offset. For example, the voltage position of the read voltage level 70 may be slightly away from the junction between the states 701 and 702 after the threshold voltage distribution of the memory cells is offset. Taking FIG. 7 as an example, after the offset occurs, the voltage position of the read voltage level 70 is closer to the peak position of the state 702. It should be noted that the invention does not limit the actual threshold voltage distribution of the offset memory cells.

After the threshold voltage distribution of the memory cells is offset, if the uncalibrated read voltage level 70 is still used to read data from the first physical unit, the read data may contain more error bits. Once the total number of error bits in the read data exceeds the upper limit of the number of error bits that may be corrected by the EDAC circuit 54, the error bits in the data may not be completely corrected.

In an exemplary embodiment, the memory management circuit 51 may perform an optimal read level search operation to find an optimal voltage position of the current read voltage level 70. However, during the optimal read level search operation, the first physical unit is repeatedly read many times, resulting in extra energy consumption of the memory storage device 10. Moreover, in general, after a plurality of retry reads of a specific physical unit and a plurality of decodings of the read data, only if the read data still may not be successfully decoded (that is, not all errors in the data may be corrected) is then the optimal read level search operation performed. In this case, although the optimal read level search operation may be used to calibrate the default read voltage level, it also causes a significant drop in the data reading performance of the memory storage device 10.

In an exemplary embodiment, the memory management circuit 51 may apply the fine-tuning and calibration of the default read voltage level (such as the read voltage level 70) corresponding to the first physical unit to the regular data read operation of the first physical unit. For example, when a regular data read operation is performed according to a read command from the host system 11, the memory management circuit 51 may gradually calibrate the default read voltage level according to the read result. Accordingly, even if the threshold voltage distribution of the memory cells in the first physical unit keeps changing, the voltage position of the default read voltage level corresponding to the first physical unit may always be kept at a relatively better voltage position, thereby improving the data accuracy of the read data.

In an exemplary embodiment, compared with the traditional optimal read level search operation, applying the fine-tuning and calibration of the default reading voltage level to the regular data read operation of the first physical unit may effectively calibrate the first default read voltage level with minimal influence to the data reading performance of the memory storage device 10. Moreover, applying the fine-tuning or calibration of the first default read voltage level to the regular data read operation of the first physical unit may also reduce the number of performance of the optimal read level search operation, and may even completely avoid performing the traditional optimal read level search operation, thereby effectively cutting down the energy consumption of the memory storage device 10.

In an exemplary embodiment, at a certain time point (also referred to as a first time point), the memory management circuit 51 may receive a read command (also referred to as a first read command) from the host system 11. The first read command may instruct to read data belonging to a specific logical unit (also referred to as a first logical unit), and the first logical unit may be mapped to the first physical unit.

In an exemplary embodiment, according to the first read command, the memory management circuit 51 may send a read command sequence (also referred to as a first read command sequence) to the rewritable non-volatile memory module 43 based on a specific read voltage level (also referred to as a first read voltage level). The first read command sequence may be used to instruct the rewritable non-volatile memory module 43 to read the first physical unit to obtain data (also referred to as first data) based on the first read voltage level. In an exemplary embodiment, the first read voltage level may be a default read voltage level (for example, the read voltage level 70) corresponding to the first physical unit. Alternatively, in an exemplary embodiment, there may be one voltage difference (also referred to as a first voltage difference) between the first read voltage level and the default read voltage level.

In an exemplary embodiment, after the first data is obtained, the memory management circuit 51 may decode the first data via the EDAC circuit 54 to obtain error bit information (also referred to as first error bit information) corresponding to the first data. For example, the first error bit information may include one value (also referred to as a first value). The first value may reflect or be positively related to a bit error rate (BER) of the first data. That is, if the bit error rate of the first data is higher (that is, the total number of error bits in the first data is larger), the first value may be larger.

In an exemplary embodiment, the EDAC circuit 54 may successfully decode the first data. That is, the EDAC circuit 54 may successfully correct all error bits in the first data. The memory management circuit 51 may obtain the first error bit information according to information related to the bit error rate of the first data, such as the total number of error bits in the first data recorded by the EDAC circuit 54 during the decoding process of the first data. The successfully decoded first data may be returned to the host system 11 in response to the first read command.

In an exemplary embodiment, at another time point (also referred to as a second time point), the memory management circuit 51 may receive another read command (also referred to as a second read command) from the host system 11. The first time point may be different from the second time point. For example, the first time point may be earlier or later than the second time point. Similar to the first read command, the second read command may instruct to read data belonging to the first logical unit, and the first logical unit may be mapped to the first physical unit.

In an exemplary embodiment, according to the second read command, the memory management circuit 51 may send a read command sequence (also referred to as a second read command sequence) to the rewritable non-volatile memory module 43 based on another read voltage level (also referred to as a second read voltage level). The second read command sequence may be used to instruct the rewritable non-volatile memory module 43 to read the first physical unit to obtain data (also referred to as second data) based on the second read voltage level. For example, there is also one voltage difference (also referred to as a second voltage difference) between the second read voltage level and the default read voltage level.

In an exemplary embodiment, the voltage value of the first read voltage level may be different from the voltage value of the second read voltage level. For example, the voltage value of the first read voltage level may be the less than or greater than the voltage value of the second read voltage level. Or, in an exemplary embodiment, when there is a first voltage difference between the first read voltage level and the default read voltage level, the voltage value of the default read voltage level may be between the voltage value of the first read voltage level and the voltage value of the second read voltage level.

In an exemplary embodiment, after the second data is obtained, the memory management circuit 51 may decode the second data via the EDAC circuit 54 to obtain error bit information (also referred to as second error bit information) corresponding to the second data. For example, the second error bit information may include one value (also referred to as a second value). The second value may reflect or be positively related to the bit error rate (BER) of the second data. That is, if the bit error rate of the second data is higher (that is, the total number of error bits in the second data is larger), the second value may be larger.

In an exemplary embodiment, the EDAC circuit 54 may also successfully decode the second data. That is, the EDAC circuit 54 may successfully correct all error bits in the second data. The memory management circuit 51 may obtain the second error bit information according to information related to the bit error rate of the second data, such as the total number of error bits in the second data recorded by the EDAC circuit 54 during the decoding process of the second data. The successfully decoded second data may also be returned to the host system 11 in response to the second read command.

In an exemplary embodiment, the memory management circuit 51 may calibrate the default read voltage level according to the first error bit information and the second error bit information. In an exemplary embodiment, the memory management circuit 51 can, according to the first error bit information and the second error bit information, adjust the default read voltage level using one voltage difference (also referred to as a target voltage difference) to calibrate the default read voltage level. For example, the target voltage difference may be one of the first voltage difference and the second voltage difference. For example, the memory management circuit 51 may compare the first error bit information and the second error bit information and determine one of the first voltage difference and the second voltage difference as the target voltage difference according to the comparison result. Then, the memory management circuit 51 may add the default read voltage level to the target voltage difference to calibrate the default read voltage level.

It should be noted that, in an exemplary embodiment, in response to the first read command, the memory management circuit 51 may send the first read command sequence before any data read from the first physical unit is decoded to instruct the rewritable non-volatile memory module to read the first physical unit based on the first read voltage level to obtain the first data. Similarly, it should be noted that, in an exemplary embodiment, in response to the second read command, the memory management circuit 51 may send the second read command sequence before any data read from the first physical unit is decoded to instruct the rewritable non-volatile memory module to read the first physical unit based on the second read voltage level to obtain the second data.

In other words, the rewritable non-volatile memory module 43 reads the first physical unit based on the first read voltage level and the second read voltage level to obtain the first data and the second data respectively, which belongs to regular data reading operation, rather than a retry read operation or other error handling procedures after the decoding failure of specific data occurs.

Taking FIG. 7 as an example, in an exemplary embodiment, it is assumed that the first read voltage level is the read voltage level 70 (that is, corresponds to the default read voltage level of the first physical unit) and the second read voltage level is the read voltage level 71. There is a voltage difference $-\Delta V$ between the read voltage levels 70 and 71. After the first read command is received from the host system 11, the memory management circuit 51 may perform one regular read operation (also referred to as a first regular read operation) according to the first read command. In the first regular read operation, the memory management circuit 51 may instruct the rewritable non-volatile memory module 43 to read the first physical unit using the read voltage level 70 to obtain the first data. Then, the EDAC circuit 54 may decode the first data. The memory management circuit 51 may obtain the first error bit information according to the decoding result of the first data. In addition, the memory management circuit 51 may return the decoded first data to the host system 11 in response to the first read command.

Moreover, after the second read command is received from the host system 11, the memory management circuit 51 may perform another regular read operation (also referred to as a second regular read operation) according to the second read command. In the second regular read operation, the memory management circuit 51 may instruct the rewritable non-volatile memory module 43 to read the first physical unit using the read voltage level 71 to obtain the second data. Then, the EDAC circuit 54 may decode the second data. The memory management circuit 51 may obtain the second error bit information according to the decoding result of the second data. In addition, the memory management circuit 51 may return the decoded second data to the host system 11 in response to the second read command.

According to the first error bit information and the second error bit information, the memory management circuit 51 may set the target voltage difference as $-\Delta V$ and calibrate the default read voltage level according to the target voltage difference. For example, the memory management circuit 51 may compare the first value and the second value. It should be noted that, in the exemplary embodiment of FIG. 7, it is assumed that the second value is less than the first value. Therefore, according to the comparison result of the first value and the second value (that is, the second value is less than the first value), the memory management circuit 51 may know that the bit error rate of the second data is less than the bit error rate of the first data. In response to the bit error rate of the second data being less than the bit error rate of the first data (or the comparison result of the first value and the second value), the memory management circuit 51 may update the voltage value of the default read voltage level to a voltage value that is the same as or closer to the read voltage level 71 (for example, adding $-\Delta V$ to the voltage value of the read voltage level 70 to obtain the calibrated default read voltage level). Then, reading data from the first physical unit using the calibrated default read voltage level may reduce the bit error rate of the read data. Moreover, in an exemplary embodiment, if the comparison result of the first value and the second value reflects that the bit error rate of the first data is less than the bit error rate of the second data (that is, the first value is less than the second value), the memory management circuit 51 may maintain the voltage value of the default read voltage level at the same voltage value as the read voltage level 70.

Figure 8:
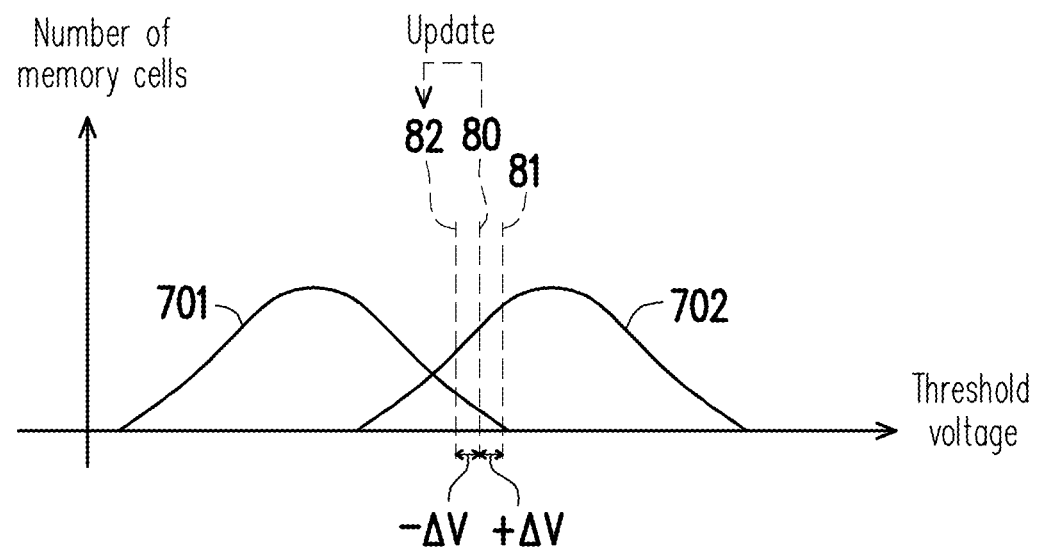
FIG. 8 is a schematic diagram of threshold voltage distribution of memory cells and calibrated default read voltage level shown according to an exemplary embodiment of the invention.

FIG. 8 is a schematic diagram of threshold voltage distribution of memory cells and calibrated default read voltage level shown according to an exemplary embodiment of the invention. Please refer to FIG. 8, in an exemplary embodiment, it is assumed that a read voltage level 80 is the default read voltage level corresponding to the first physical unit, the first read voltage level is a read voltage level 81, and the second read voltage level is a read voltage level 82. There is a voltage difference +ΔV between the read voltage levels 80 and 81. There is a voltage difference −ΔV between the read voltage levels 80 and 82. The voltage value of the read voltage level 80 is between the voltage value of the read voltage level 81 and the voltage value of the read voltage level 82. It should be noted that, in an exemplary embodiment, the first read voltage level may also be the read voltage level 82, and the second read voltage level may also be the read voltage level 81, and the invention is not limited thereto.

In an exemplary embodiment of FIG. 8, after the first read command is received from the host system 11, the memory management circuit 51 may perform one regular read operation (i.e., a first regular read operation) according to the first read command. In the first regular read operation, the memory management circuit 51 may instruct the rewritable non-volatile memory module 43 to read the first physical unit using the read voltage level 81 to obtain the first data. Then, the EDAC circuit 54 may decode the first data. The memory management circuit 51 may obtain the first error bit information according to the decoding result of the first data. In addition, the memory management circuit 51 may return the decoded first data to the host system 11 in response to the first read command.

Moreover, after the second read command is received from the host system 11, the memory management circuit 51 may perform another regular read operation (i.e., a second regular read operation) according to the second read command. In the second regular read operation, the memory management circuit 51 may instruct the rewritable non-volatile memory module 43 to read the first physical unit using the read voltage level 82 to obtain the second data. Then, the EDAC circuit 54 may decode the second data. The memory management circuit 51 may obtain the second error bit information according to the decoding result of the second data. In addition, the memory management circuit 51 may return the decoded second data to the host system 11 in response to the second read command.

According to the first error bit information and the second error bit information, the memory management circuit 51 may set the target voltage difference as −ΔV and calibrate the default read voltage level according to the target voltage difference. For example, the memory management circuit 51 may compare the first value and the second value. It should be noted that, in the exemplary embodiment of FIG. 8, it is assumed that the second value is less than the first value. Therefore, according to the comparison result of the first value and the second value (that is, the second value is less than the first value), the memory management circuit 51 may know that the bit error rate of the second data is less than the bit error rate of the first data. In response to the bit error rate of the second data being less than the bit error rate of the first data (or the comparison result of the first value and the second value), the memory management circuit 51 may update the voltage value of the default read voltage level to a voltage value that is the same as or closer to the read voltage level 82 (for example, adding −ΔV to the voltage value of the read voltage level 80 to obtain the calibrated default read voltage level). Then, reading data from the first physical unit using the calibrated default read voltage level may reduce the bit error rate of the read data. Moreover, in an exemplary embodiment, if the comparison result of the first value and the second value reflects that the bit error rate of the first data is less than the bit error rate of the second data (that is, the first value is less than the second value), the memory management circuit 51 may update the voltage value of the default read voltage level to a voltage value that is the same as or closer to the read voltage level 81 (for example, +ΔV is add to the voltage value of the read voltage level 80 to obtain the calibrated default read voltage level).

It should be noted that, in the exemplary embodiment of FIG. 7, the operations of reading data respectively from the first physical unit using the read voltage levels 70 and 71 are respectively performed in response to the first read command and the second read command from the host system 11. Similarly, in the exemplary embodiment of FIG. 8, the operations of reading data respectively from the first physical unit using the read voltage levels 81 and 82 are respectively performed in response to the first read command and the second read command from the host system 11. In other words, the operations of reading data from the first physical unit respectively using the read voltage levels 70, 71, 81, and 82 all belong to regular data read operations and do not belong to retry read operations or other error handling procedures after a failure to decode specific data occurs.

In an exemplary embodiment, both the first read voltage level and the second read voltage level may be determined according to the default read voltage level corresponding to the first physical unit. For example, the first read voltage level may be set to be the same as the default read voltage level or have a first voltage difference (e.g., +ΔV of FIG. 8) from the default read voltage level, and the second read voltage level may be set to have a second voltage difference (e.g., −ΔV in FIG. 7 and FIG. 8) from the default read voltage level. In an exemplary embodiment, both positive and negative values and absolute values of the first voltage difference and the second voltage difference may be adjusted according to practical needs, and the invention is not limited thereto.

In an exemplary embodiment, both the first voltage difference and the second voltage difference may be limited within one default voltage offset range. As long as both the first voltage difference and the second voltage difference are within the voltage offset range, the successful decode of the data (that is, the first data) read using the offset first read voltage level and the data (that is, the second data) respectively read by the offset second read voltage level may be effectively ensured. Accordingly, the calibration of the default read voltage level corresponding to the first physical unit may also be continuously performed along with the regular data read operation without entering retry read or performing an optimal read level search operation. In an exemplary embodiment, the default read voltage level may also be calibrated according to the averaged first error bit information and the averaged second error bit information only after a plurality of repeated regular read operations are performed, thereby avoid adjusting the default read voltage level too frequently.

In an exemplary embodiment, the memory management circuit 51 may also apply the calibration for the default read voltage level corresponding to the first physical unit to another physical unit (also referred to as a second physical unit) in the rewritable non-volatile memory module 43 to calibrate the default read voltage level corresponding to the second physical unit. For example, after deciding to adopt the target voltage difference (such as −ΔV of FIG. 7 or FIG. 8) to calibrate the default read voltage level corresponding to the first physical unit, the target voltage difference may also be used to calibrate the default read voltage level corresponding to the second physical unit.

In an exemplary embodiment, the first physical unit and the second physical unit may belong to the same die, the same plane, or the same chip-enabled (CE) area in the rewritable non-volatile memory module 43. Moreover, the second physical unit may also include other physical units in the rewritable non-volatile memory module 43 having use conditions (e.g., P/E cycle) the same as or similar to those of the first physical unit, and the invention is not limited thereto. Thereby, the calibration efficiency of the default read voltage levels corresponding to physical units having the same or similar use conditions may be accelerated.

Figure 9:
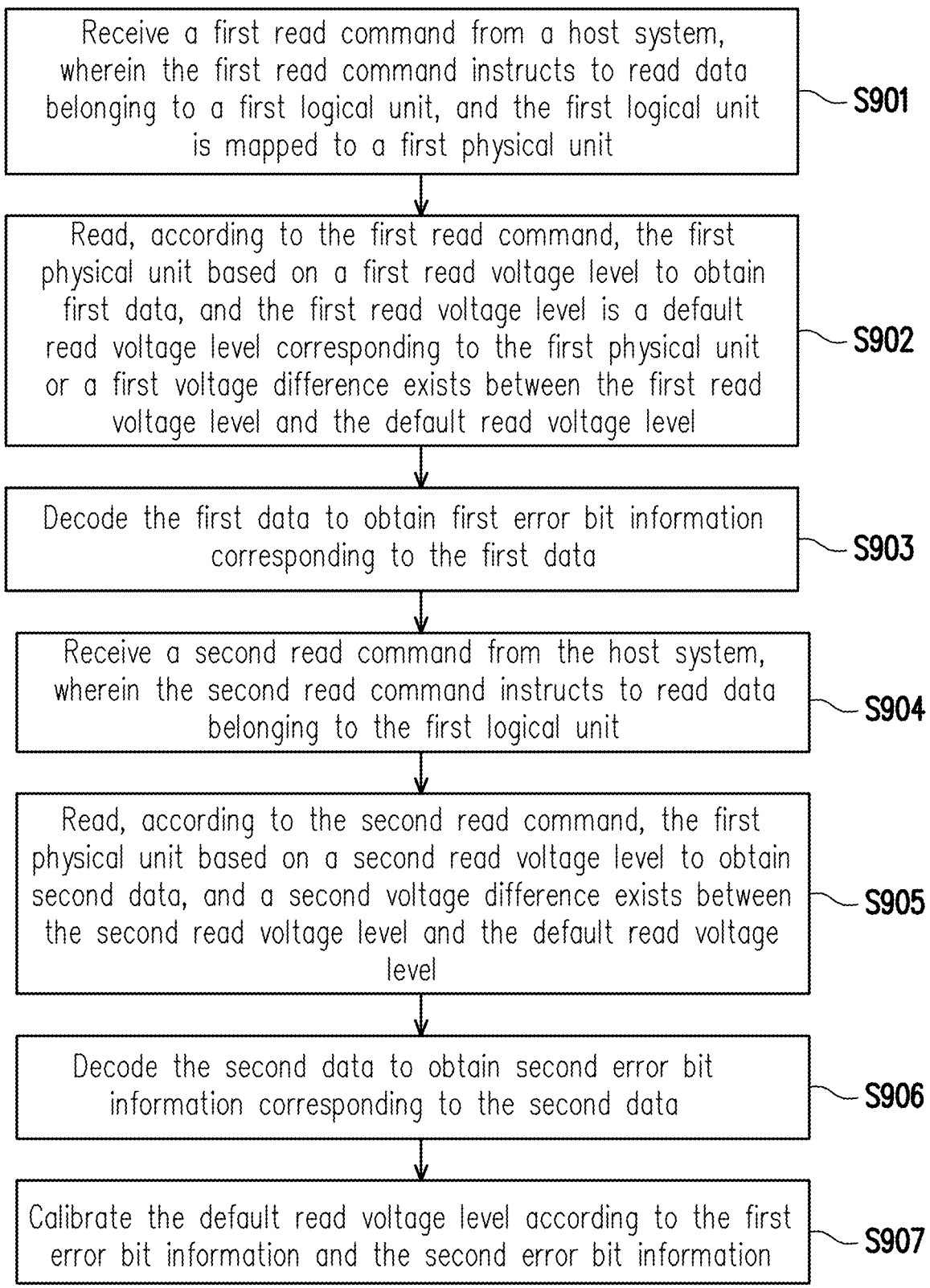
FIG. 9 is a flowchart of a read voltage calibration method shown according to an exemplary embodiment of the invention.

FIG. 9 is a flowchart of a read voltage calibration method shown according to an exemplary embodiment of the invention. Referring to FIG. 9, in step S901, a first read command is received from a host system, wherein the first read command instructs to read data belonging to a first logical unit, and the first logical unit is mapped to a first physical unit. In step S901, the first physical unit is read based on a first read voltage level according to the first read command to obtain first data, and the first read voltage level is a default read voltage level corresponding to the first physical unit or a first voltage difference exists between the first read voltage level and the default read voltage level. In step S903, the first data is decoded to obtain first error bit information corresponding to the first data. In step S904, a second read command is received from the host system, wherein the second read command instructs to read the data belonging to the first logical unit. In step S905, the first physical unit is read based on a second read voltage level according to the second read command to obtain second data, and a second voltage difference exists between the second read voltage level and the default read voltage level. In step S906, the second data is decoded to obtain second error bit information corresponding to the second data. In step S907, the default read voltage level is calibrated according to the first error bit information and the second error bit information.

However, each step in FIG. 9 is as described in detail above, and is not repeated herein. It should be mentioned that, each step in FIG. 9 may be implemented as a plurality of program codes or circuits, and the invention is not limited thereto. Moreover, the method of FIG. 9 may be used with the above exemplary embodiments, and may also be used alone, and the invention is not limited thereto.

Based on the above, the read voltage calibration method, the memory storage device, and the memory control circuit unit provided by the exemplary embodiments of the invention may apply the fine-tuning and calibration of the default read voltage level of a specific physical unit to the regular data read operation of the specific physical unit. Accordingly, even if the threshold voltage distribution of the memory cells in the specific physical unit keeps changing, the voltage position of the default read voltage level corresponding to the specific physical unit may always be kept at a relatively better voltage position, thereby improving the data quality of the read data. Moreover, compared with the conventional optimal read level search operation, the calibration operation of the default read voltage level provided by an exemplary embodiment of the invention may effectively calibrate the default read voltage level of the specific physical unit with minimal influence to the data reading performance of the memory storage device and without a significantly increase in energy consumption.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A read voltage calibration method, configured for a rewritable non-volatile memory module, wherein the rewritable non-volatile memory module comprises a plurality of physical units, and the read voltage calibration method comprises:
receiving a first read command from a host system, wherein the first read command instructs to read data belonging to a first logical unit, and the first logical unit is mapped to a first physical unit in the plurality of physical units;
reading, according to the first read command, the first physical unit based on a first read voltage level to obtain first data, and the first read voltage level is a default read voltage level corresponding to the first physical unit or a first voltage difference exists between the first read voltage level and the default read voltage level;
decoding the first data to obtain first error bit information corresponding to the first data;
receiving a second read command from the host system, wherein the second read command instructs to read the data belonging to the first logical unit;
reading, according to the second read command, the first physical unit based on a second read voltage level to obtain second data, and a second voltage difference exists between the second read voltage level and the default read voltage level, wherein the reading based on the first read voltage level and the reading based on the second read voltage level both belong to a regular data reading operation, rather than a retry read operation or an error handling procedure;
decoding the second data to obtain second error bit information corresponding to the second data; and
calibrating the default read voltage level according to the first error bit information and the second error bit information.

2. The read voltage calibration method of claim 1, wherein a voltage value of the first read voltage level is different from a voltage value of the second read voltage level.

3. The read voltage calibration method of claim 1, wherein when the first voltage difference exists between the first read voltage level and the default read voltage level, a voltage value of the default read voltage level is between a voltage value of the first read voltage level and a voltage value of the second read voltage level.

4. The read voltage calibration method of claim 1, wherein the first error bit information comprises a first value, the first value is positively related to a bit error rate of the first data, the second error bit information comprises a second value, and the second value is positively related to a bit error rate of the second data.

5. The read voltage calibration method of claim 1, wherein calibrating the default read voltage level according to the first error bit information and the second error bit information comprises:
adjusting the default read voltage level using a target voltage difference according to the first error bit information and the second error bit information to calibrate the default read voltage level,
wherein the target voltage difference is one of the first voltage difference and the second voltage difference.

6. The read voltage calibration method of claim 5, wherein adjusting the default read voltage level using the target voltage difference according to the first error bit information and the second error bit information comprises:
  comparing the first error bit information and the second error bit information; and
  determining the one of the first voltage difference and the second voltage difference as the target voltage difference according to a comparison result.

7. The read voltage calibration method of claim 1, wherein reading the first physical unit to obtain the first data based on the first read voltage level according to the first read command comprises:
  reading the first physical unit based on the first read voltage level to obtain the first data before any data read from the first physical unit is decoded in response to the first read command,
  wherein reading the first physical unit to obtain the second data based on the second read voltage level according to the second read command comprises:
  reading the first physical unit based on the second read voltage level to obtain the second data before any data read from the first physical unit is decoded in response to the second read command.

8. The read voltage calibration method of claim 1, further comprising:
  applying a calibration for the default read voltage level to a second physical unit in the plurality of physical units to calibrate a default read voltage level corresponding to the second physical unit,
  wherein the first physical unit and the second physical unit belong to a same die, a same plane, or a same chip-enabled area in the rewritable non-volatile memory module.

9. A memory storage device, comprising:
  a connection interface unit configured to be coupled to a host system;
  a rewritable non-volatile memory module comprising a plurality of physical units; and
  a memory control circuit unit coupled to the connection interface unit and the rewritable non-volatile memory module,
  wherein the memory control circuit unit is configured to:
    receive a first read command from the host system, wherein the first read command instructs to read data belonging to a first logical unit, and the first logical unit is mapped to a first physical unit in the plurality of physical units;
    send, according to the first read command, a first read command sequence instructing to read the first physical unit based on a first read voltage level to obtain first data, and the first read voltage level is a default read voltage level corresponding to the first physical unit or a first voltage difference exists between the first read voltage level and the default read voltage level;
    decode the first data to obtain first error bit information corresponding to the first data;
    receive a second read command from the host system, wherein the second read command instructs to read the data belonging to the first logical unit;
    send, according to the second read command, a second read command sequence instructing to read the first physical unit based on a second read voltage level to obtain second data, and a second voltage difference exists between the second read voltage level and the default read voltage level, wherein the reading based on the first read voltage level and the reading based on the second read voltage level both belong to a regular data reading operation, rather than a retry read operation or an error handling procedure;
    decode the second data to obtain second error bit information corresponding to the second data; and
    calibrate the default read voltage level according to the first error bit information and the second error bit information.

10. The memory storage device of claim 9, wherein a voltage value of the first read voltage level is different from a voltage value of the second read voltage level.

11. The memory storage device of claim 9, wherein when the first voltage difference exists between the first read voltage level and the default read voltage level, a voltage value of the default read voltage level is between a voltage value of the first read voltage level and a voltage value of the second read voltage level.

12. The memory storage device of claim 9, wherein the first error bit information comprises a first value, the first value is positively related to a bit error rate of the first data, the second error bit information comprises a second value, and the second value is positively related to a bit error rate of the second data.

13. The memory storage device of claim 9, wherein calibrating the default read voltage level according to the first error bit information and the second error bit information comprises:
  adjusting the default read voltage level using a target voltage difference according to the first error bit information and the second error bit information to calibrate the default read voltage level,
  wherein the target voltage difference is one of the first voltage difference and the second voltage difference.

14. The memory storage device of claim 13, wherein adjusting the default read voltage level using the target voltage difference according to the first error bit information and the second error bit information comprises:
  comparing the first error bit information and the second error bit information; and
  determining the one of the first voltage difference and the second voltage difference as the target voltage difference according to a comparison result.

15. The memory storage device of claim 9, wherein sending, according to the first read command, the first read command sequence instructing to read the first physical unit based on the first read voltage level to obtain the first data comprises:
  sending the first read command sequence instructing to read the first physical unit based on the first read voltage level to obtain the first data before any data read from the first physical unit is decoded in response to the first read command,
  wherein sending, according to the second read command, the second read command sequence instructing to read the first physical unit based on the second read voltage level to obtain the second data comprises:
  sending the second read command sequence instructing to read the first physical unit based on the second read voltage level to obtain the second data before any data read from the first physical unit is decoded in response to the second read command.

16. The memory storage device of claim 9, wherein the memory control circuit unit is further configured to:

apply a calibration for the default read voltage level to a second physical unit in the plurality of physical units to calibrate a default read voltage level corresponding to the second physical unit, wherein the first physical unit and the second physical unit belong to a same die, a same plane, or a same chip-enabled area in the rewritable non-volatile memory module.

17. A memory control circuit unit, configured to control a rewritable non-volatile memory module, wherein the rewritable non-volatile memory module comprises a plurality of physical units, and the memory control circuit unit comprises:

a host interface configured to be coupled to a host system;
a memory interface configured to be coupled to the rewritable non-volatile memory module;
an error detection and correction circuit; and
a memory management circuit coupled to the host interface, the memory interface, and the error detection and correction circuit,
wherein the memory management circuit is configured to:
receive a first read command from the host system, wherein the first read command instructs to read data belonging to a first logical unit, and the first logical unit is mapped to a first physical unit in the plurality of physical units;
send, according to the first read command, a first read command sequence instructing to read the first physical unit based on a first read voltage level to obtain first data, and the first read voltage level is a default read voltage level corresponding to the first physical unit or a first voltage difference exists between the first read voltage level and the default read voltage level;
decode the first data via the error detection and correction circuit to obtain first error bit information corresponding to the first data;
receive a second read command from the host system, wherein the second read command instructs to read the data belonging to the first logical unit;
send, according to the second read command, a second read command sequence instructing to read the first physical unit based on a second read voltage level to obtain second data, and a second voltage difference exists between the second read voltage level and the default read voltage level, wherein the reading based on the first read voltage level and the reading based on the second read voltage level both belong to a regular data reading operation, rather than a retry read operation or an error handling procedure;
decode the second data via the error detection and correction circuit to obtain second error bit information corresponding to the second data; and
calibrate the default read voltage level according to the first error bit information and the second error bit information.

18. The memory control circuit unit of claim 17, wherein a voltage value of the first read voltage level is different from a voltage value of the second read voltage level.

19. The memory control circuit unit of claim 17, wherein when the first voltage difference exists between the first read voltage level and the default read voltage level, a voltage value of the default read voltage level is between a voltage value of the first read voltage level and a voltage value of the second read voltage level.

20. The memory control circuit unit of claim 17, wherein the first error bit information comprises a first value, the first value is positively related to a bit error rate of the first data, the second error bit information comprises a second value, and the second value is positively related to a bit error rate of the second data.

21. The memory control circuit unit of claim 17, wherein calibrating the default read voltage level according to the first error bit information and the second error bit information comprises:

adjusting the default read voltage level using a target voltage difference according to the first error bit information and the second error bit information to calibrate the default read voltage level,
wherein the target voltage difference is one of the first voltage difference and the second voltage difference.

22. The memory control circuit unit of claim 21, wherein adjusting the default read voltage level using the target voltage difference according to the first error bit information and the second error bit information comprises:

comparing the first error bit information and the second error bit information; and
determining the one of the first voltage difference and the second voltage difference as the target voltage difference according to a comparison result.

23. The memory control circuit unit of claim 17, wherein sending, according to the first read command, the first read command sequence instructing to read the first physical unit based on the first read voltage level to obtain the first data comprises:

sending the first read command sequence instructing to read the first physical unit based on the first read voltage level to obtain the first data before any data read from the first physical unit is decoded in response to the first read command,
wherein sending, according to the second read command, the second read command sequence instructing to read the first physical unit based on the second read voltage level to obtain the second data comprises:
sending the second read command sequence instructing to read the first physical unit based on the second read voltage level to obtain the second data before any data read from the first physical unit is decoded in response to the second read command.

24. The memory control circuit unit of claim 17, wherein the memory management circuit is further configured to:

apply a calibration for the default read voltage level to a second physical unit in the plurality of physical units to calibrate a default read voltage level corresponding to the second physical unit,
wherein the first physical unit and the second physical unit belong to a same die, a same plane, or a same chip-enabled area in the rewritable non-volatile memory module.

* * * * *